US010295624B2

(12) United States Patent
Adalsteinsson et al.

(10) Patent No.: US 10,295,624 B2
(45) Date of Patent: May 21, 2019

(54) DECOUPLING OF PARALLEL TRANSMISSION ARRAYS IN MAGNETIC RESONANCE IMAGING

(71) Applicants: Elfar Adalsteinsson, Belmont, MA (US); Luca Daniel, Cambridge, MA (US); Bastien Guerin, Cambridge, MA (US); Zohaib Mahmood, Cambridge, MA (US); Markus Vester, Nürnberg (DE); Lawrence Wald, Cambridge, MA (US)

(72) Inventors: Elfar Adalsteinsson, Belmont, MA (US); Luca Daniel, Cambridge, MA (US); Bastien Guerin, Cambridge, MA (US); Zohaib Mahmood, Cambridge, MA (US); Markus Vester, Nürnberg (DE); Lawrence Wald, Cambridge, MA (US)

(73) Assignees: Massachusetts Institute of Technology, Cambridge, MA (US); Massachusetts General Hospital, Boston, MA (US); Siemens Healthcare GmbH, Erlangen (DE)

( * ) Notice: Subject to any disclaimer, the term of this patent is extended or adjusted under 35 U.S.C. 154(b) by 1158 days.

(21) Appl. No.: 13/918,461

(22) Filed: Jun. 14, 2013

(65) Prior Publication Data

US 2014/0292337 A1 Oct. 2, 2014

Related U.S. Application Data

(60) Provisional application No. 61/807,177, filed on Apr. 1, 2013.

(51) Int. Cl.
*G01V 3/00* (2006.01)
*G01R 33/36* (2006.01)
*G01R 33/561* (2006.01)

(52) U.S. Cl.
CPC ........ *G01R 33/365* (2013.01); *G01R 33/5612* (2013.01)

(58) Field of Classification Search
CPC .. A61B 5/055; G01R 33/543; G01R 33/5608; G01R 33/385; G01R 33/5616
(Continued)

(56) References Cited

U.S. PATENT DOCUMENTS 5,572,125 A * 11/1996 Dunkel .............. G01R 33/3875
324/307
5,687,104 A * 11/1997 Lane ...................... H03G 5/005
708/300
(Continued)

FOREIGN PATENT DOCUMENTS

| CN | 1479113 A | 3/2004 |
|---|---|---|
| CN | 101067649 A | 11/2007 |

(Continued)

OTHER PUBLICATIONS

Bastien Guerin et al., "Simulation of Parallel Transmit Arrays for 3T Body Imaging under Local and Global SAR Constraints", Proc. Intl. Soc. Mag. Reson. Med. 20, 2012, 1 page.
(Continued)

*Primary Examiner* — Walter L Lindsay, Jr.

(57) ABSTRACT

A method of determining a decoupling matrix of a decoupling system for an array of coils of a parallel transmission magnetic resonance imaging (MRI) system includes obtaining impedance matrix data for the array of coils without the decoupling system, determining, based on the impedance matrix data for the array of coils, an objective function representative of deviation from a decoupled operating condition for the array of coils in which the array of coils are decoupled via the decoupling system, and defining, with a processor, a decoupling matrix representative of a set of impedances of the decoupling system with an iterative (Continued)

procedure that optimizes elements of the decoupling matrix to minimize the objective function and reach the decoupled operating condition.

20 Claims, 7 Drawing Sheets

(58) Field of Classification Search
USPC .......................................................... 324/322
See application file for complete search history.

(56) References Cited

U.S. PATENT DOCUMENTS

| | | | |
|---|---|---|---|
| 7,999,548 B1 * | 8/2011 | Brown | A61B 5/055 |
| | | | 324/307 |
| 2003/0214299 A1 | 11/2003 | Lee et al. | |
| 2007/0273377 A1 * | 11/2007 | Yang | G01R 33/3415 |
| | | | 324/318 |
| 2009/0076377 A1 * | 3/2009 | Findekelee | G01R 33/365 |
| | | | 600/422 |
| 2010/0327868 A1 | 12/2010 | Gebhardt et al. | |

FOREIGN PATENT DOCUMENTS

| | | | |
|---|---|---|---|
| CN | 102636763 A | 8/2012 | |
| JP | 2003167941 A | 6/2003 | |
| JP | 2004000616 A | 1/2004 | |
| WO | 2011148278 A1 | 12/2011 | |
| WO | 2013008116 A1 | 1/2013 | |

OTHER PUBLICATIONS

Jovan Jevtic, "Ladder Networks for Capacitive Decoupling in Phased-Array Coils", Proc. Intl. Soc. Mag. Reson. Med 9, 2001, 1 page.

Mikhail Kozlov et al., "Fast MRI Coil Analysis Based on 3-D Electromagnetic and RF Circuit Co-Simulation", Journal of Magnetic Resonance 200, 2009, pp. 147-152.

Ray F. Lee et al., "Coupling and Decoupling Theory and Its Application to the MRI Phased Array", Magnetic Resonance in Medicine, 2002, pp. 203-213, vol. 48.

V. Alagappan et al., "Comparison of Three Transmit Arrays for Parallel Transmit", Proc. Intl. Soc. Mag. Reson. Med. 15, 2007, 1 page.

Office Action dated Apr. 26, 2016 in CN Application No. 2014101288641, 18 pages.

Office action dated Jan. 26, 2018 in JP Patent Application No. 2014-075459, 6 pages, English translation attached.

* cited by examiner

DECOUPLING OF PARALLEL TRANSMISSION ARRAYS IN MAGNETIC RESONANCE IMAGING

CROSS-REFERENCE TO RELATED APPLICATION

This application claims the benefit of the U.S. provisional application entitled "Decoupling of Parallel Transmission Arrays in Magnetic Resonance Imaging," filed Apr. 1, 2013, and assigned Ser. No. 61/807,177, the entire disclosure of which is hereby incorporated by reference.

STATEMENT REGARDING FEDERALLY SPONSORED RESEARCH OR DEVELOPMENT

This invention was made with government support under Research Grant Program (R01) Contract Nos. EB006847 and EB007942 awarded by the National Institutes of Health (NIH). The government has certain rights in the invention.

FIELD

The disclosure relates generally to magnetic resonance imaging (MRI) systems and, more particularly, to MRI systems having parallel transmission arrays.

BACKGROUND

Magnetic resonance imaging (MRI) is a medical imaging technique in widespread use for viewing the structure and function of the human body. MRI systems provide soft-tissue contrast, such as for diagnosing many soft-tissue disorders. MRI systems generally implement a two-phase method. The first phase is the excitation phase, in which a magnetic resonance signal is created in the subject with a main, polarizing magnetic field, $B_0$, and a radio frequency (RF) excitation field, $B_1^+$. The second phase is the acquisition phase, in which the system receives an electromagnetic signal emitted as the precessing nuclei induce a voltage in a receive coil via the Faraday effect. After the excitation and precession phase, the nuclear magnetic moments relax back into alignment with the main magnetic field with the characteristic time T1 (e.g., about 1 second in the brain). These two phases are repeated pair-wise to acquire enough data to construct an image.

Higher magnetic field strength scanners have been recently used to improve image signal-to-noise ratio and contrast. However, a spatial variation in the magnitude of the RF excitation magnetic field, $B_1^+$, occurs with main magnetic field strengths of, for example, 7 Tesla. This undesirable non-uniformity in the excitation across the region of interest is commonly referred to as "center brightening," "$B_1^+$ inhomogeneity" or "flip angle inhomogeneity."

Newer-generation MRI systems have the capability of generating RF pulses with a spatially tailored excitation pattern to mitigate the $B_1^+$ inhomogeneity inherent to high magnetic fields by exciting a spatial inverse of the inhomogeneity. In these systems, multiple radio-frequency pulse trains are transmitted in parallel over independent radio-frequency transmit channels, e.g., the individual rods of a whole-body antenna. This method, referred to as "parallel transmission" or "parallel excitation," exploits variations among the different spatial profiles of a multi-element RF coil array. Parallel excitation has enabled several important applications beyond the mitigation of $B_1^+$ inhomogeneity, including flexibly shaped excitation volumes, and minimization and management of power deposition in tissue as measured by specific absorption rate (SAR).

Unfortunately, in parallel transmission systems, power from one channel may be coupled, i.e., partially delivered, to other channels. Such coupling interferes with the incident waves of the pulses of the other channels. Coupling also reduces the power efficiency of the MRI system, insofar as power coupled from one channel to another is redirected to resistive loads for dissipation in order to protect the power amplifiers. This power is therefore lost and cannot be used to excite the MRI signal.

SUMMARY

Decoupling matrices for an array of coils of a parallel transmission magnetic resonance imaging (MRI) system are defined via an automated technique based on an objective function representative of deviation from a decoupled operating condition. The objective function may penalize deviations of the response of the decoupling matrix from the decoupled operating condition. An iterative procedure is used to minimize the objective function to optimize elements of the decoupling matrix.

In accordance with one aspect, a method of determining a decoupling matrix of a decoupling system for an array of coils of a parallel transmission magnetic resonance imaging (MRI) system includes obtaining impedance matrix data for the array of coils without the decoupling system, determining, based on the impedance matrix data for the array of coils, an objective function representative of deviation from a decoupled operating condition for the array of coils in which the array of coils are decoupled via the decoupling system, and defining, with a processor, a decoupling matrix representative of a set of impedances of the decoupling system with an iterative procedure that optimizes elements of the decoupling matrix to minimize the objective function and attain the decoupled operating condition.

In accordance with another aspect, a method of configuring a parallel transmission MRI system with a decoupling system for an array of coils of the parallel transmission MRI system includes obtaining impedance matrix data for the array of coils without the decoupling system, determining, based on impedance matrix data for the array of coils, a cost function representative of deviation from a decoupled operating condition for the array of coils in which the array of coils are decoupled via the decoupling system, defining, with a processor, a decoupling matrix representative of a set of impedances of the decoupling system with an iterative procedure that optimizes elements of the decoupling matrix to minimize the cost function and reach the decoupled operating condition, and connecting the decoupling system to the array of coils, the decoupling system being configured in accordance with the optimized elements of the decoupling matrix.

In accordance with yet another aspect, a computer program product for determining a decoupling matrix of a decoupling system for an array of coils of a parallel transmission MRI system includes one or more computer-readable storage media having stored thereon computer-executable instructions that, when executed by one or more processors of a computing system, cause the computing system to perform the method, which includes obtaining impedance matrix data for the array of coils without the decoupling system, determining, based on the impedance matrix data for the array of coils, an objective function representative of deviation from a decoupled operating condition for the array of coils in which the array of coils are decoupled via the decoupling system, and defining a decoupling matrix representative of a set of impedances of the decoupling system with an iterative procedure that optimizes elements of the decoupling matrix to minimize the objective function and reach the decoupled operating condition.

In accordance with yet another aspect, an MRI system includes a plurality of transmitters to generate a parallel transmission radio frequency (RF) pulse, an array of coils coupled to the plurality of transmitters to apply the parallel transmission RF pulse to a subject, and a decoupling system connected to the plurality of transmitters and the array of coils and configured in accordance with a decoupling matrix to attain a decoupled operating condition for the array of coils. Each element of the decoupling matrix is representative of an impedance between a respective pair of nodes, each node being associated with either a respective one of the transmitters or a respective one of the coils. The elements of the decoupling matrix are optimized to minimize a cost function based on impedance matrix data for the array of coils without the decoupling system, the cost function being representative of deviation from the decoupled operating condition.

DETAILED DESCRIPTION OF THE DRAWINGS

Figure 1:
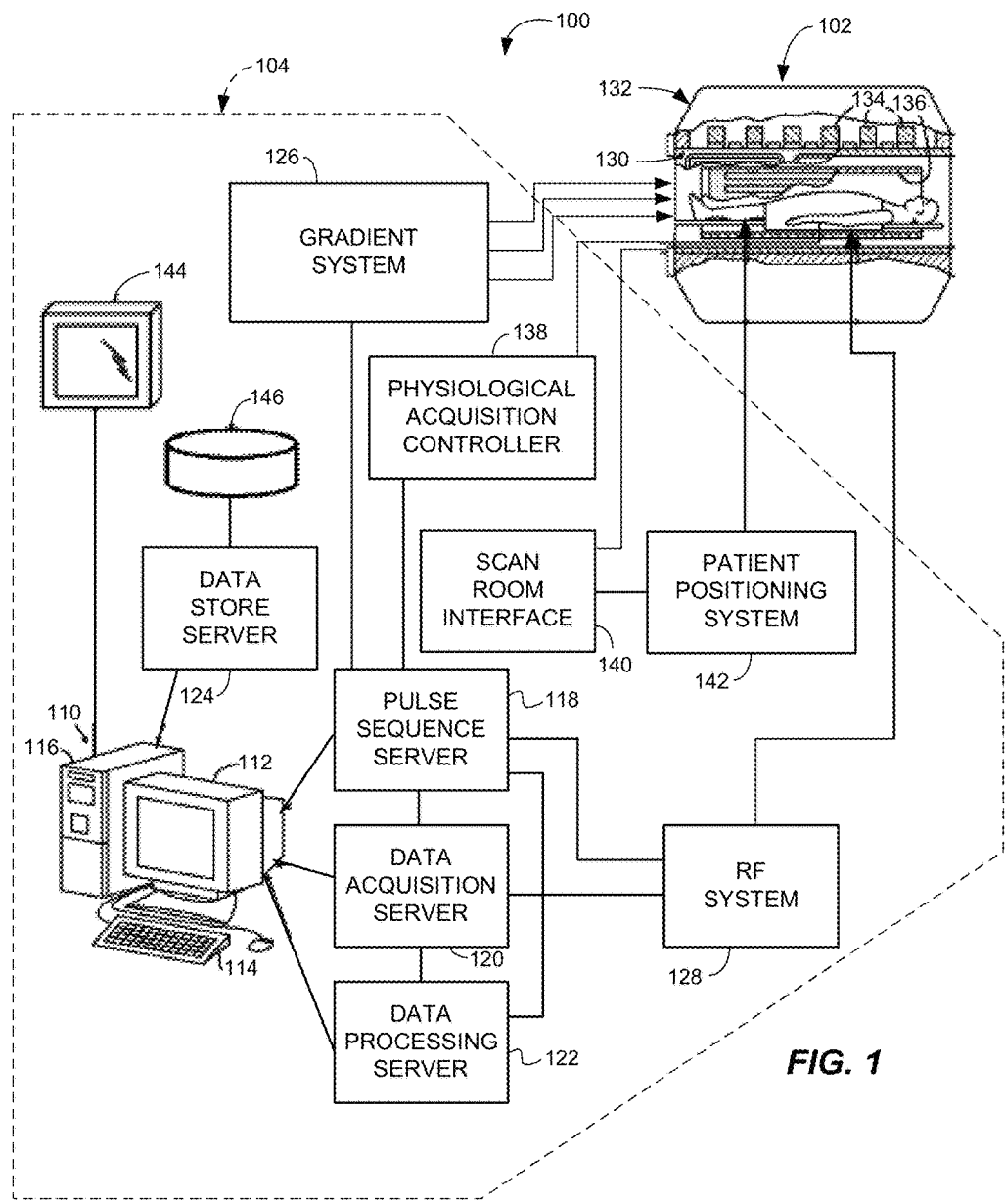
FIG. 1 is a block diagram of one embodiment of a magnetic resonance imaging (MRI) system configured in accordance with one embodiment.

The embodiments are directed to the automated configuration of a parallel transmission (pTx) magnetic resonance imaging (MRI) system. A decoupling system of the MRI system may be configured to decoupling parallel transmission radio frequency (RF) arrays of the MRI system. The decoupling system may be connected to the coil array (e.g., interfaced between power amplifiers and coils) to reduce or eliminate the transmission of power from one channel to other channels of the pTx MRI system. With the resulting improved power efficiency, the MRI system may be capable of lower operational power levels. In some cases, the lower operational power levels may lead to compatibility with lower cost power amplifiers and other cost decreases due to lower power demand during operation.

The decoupling system may be configured in accordance with a decoupling matrix optimized in accordance with the disclosed embodiments. The optimization may ensure that all (or nearly all) transmission power is directed forward to the patient, despite mixing the input signals. The optimization techniques of the disclosed embodiments may be used to determine impedance values of the decoupling system connected to the coils in accordance with the optimized decoupling matrix. In some cases, the decoupling matrix may be realized by identifying the admittance matrix thereof, which is directly related to the impedance of the components that realize the decoupling matrix.

The disclosed systems and methods implement an optimization procedure to determine a decoupling matrix for use in configuring MRI systems. The optimization procedure optimally selects a decoupling matrix based on one or more constraints on the decoupling system, such as reciprocity, passivity, and lossless elements. The optimization procedure is configured to solve a non-linear problem presented by the constraint(s) and the impedance matrix representative of the coupled array (i.e., before decoupling). The optimization procedure converges such that the resultant decoupling matrix achieves ideal decoupling. The resultant decoupling matrix may then be used to implement a circuit, described by either an impedance or admittance network of the decoupling matrix, of the decoupling system configured in accordance with the decoupling matrix. A variety of different decoupling circuits may be realized and/or implemented in accordance with the decoupling matrix.

The decoupling matrix optimized by the disclosed embodiments allows the MRI system to continue to take advantage of the degrees of freedom presented by the pTx arrangement. For example, the coupling of the coils of the array need not be addressed through preliminary pulse design adjustments. The MRI system may thus retain the increased flexibility of pTx arrangements to generate a variety of magnetization profiles relative to conventional single-channel RF systems.

The disclosed embodiments enable a decoupling system to be configured or customized for a specific coil array. The disclosed embodiments may thus be useful in connection with a variety of different types or designs of coil arrays. The disclosed embodiments are described below in connection with a 16 channel body coil with the understanding that the disclosed embodiments are not limited to a particular type of coil array or a specific number of channels.

The automation of the disclosed embodiments may address the challenge presented by parallel transmission systems having a large or considerable number of array elements. The disclosed embodiments may be used to automatically design or define a decoupling matrix for pTx arrays with many channels. The automation may avoid having to manually tune a large number of elements in, for example, a ladder network. Such tuning may be particularly challenging due to high sensitivity levels arising from the large number of elements in the network.

The disclosed methods and systems are well-suited for use with a variety of different pulse sequences, including, for example, RF shimming, spoke design, spiral trajectory excitation, spatially selective excitation, uniform volume excitation, spatial-domain design for small flip angle approximation, linear class of large tip angle pulses, and optimal control methods.

Turning now to the drawing figures, FIG. 1 depicts a magnetic resonance imaging ("MRI") system 100 configured in accordance with several aspects of the disclosure. The MRI system 100 generally includes a scanner or data acquisition unit 102 and a control system 104 for directing the operation of the scanner 102. In an excitation phase of operation, the data acquisition unit 102 creates a magnetic resonance signal by subjecting a subject to a main magnetic field, B0, to align the individual magnetic moments, or spins, of the nuclei in the tissue with the axis of the polarizing field (conventionally, the z-axis). The main magnetic field also causes the magnetic moments to resonantly precess about the axis at their characteristic Larmor frequency. The data acquisition unit 102 then subjects the tissue to a radio frequency (RF) excitation pulse, B1, with a frequency near the Larmor frequency, so that a magnetic field in the x-y plane re-orients, flips, or tips the net aligned moment, Mz, into or toward the x-y plane, producing a net transverse magnetic moment Mxy, the so-called transverse spin magnetization. The excitation phase is generally tailored to localize the excitation pulse to a specific region within the subject, such as a 3D slab or a relatively thin 2D slice. In a subsequent acquisition phase of operation, the data acquisition unit 102 encodes the localized region in all three dimensions for a 3D slab or only in-plane for a thin slice. The region to be imaged may be scanned by a sequence of measurement cycles in which magnetic field gradients ($G_x$, $G_y$, and $G_z$) vary according to the particular localization method being used. Tailored RF pulses may be used to localize the excitations.

The control system 104 includes a workstation 110 having one or more output interfaces 112 (e.g., display interfaces) and one or more input interfaces (e.g., keyboard) 114. The workstation 110 includes a computer (or processor thereof) 116, which may be a commercially available, programmable machine running a commercially available operating system. The workstation 110 provides an operator interface that enables scan sequences to be entered into or otherwise defined for the control system 104 and the MRI system 100. The workstation 110 may be coupled to a number of servers, including, in this example, a pulse sequence server 118, a data acquisition server 120, a data processing server 122, and a data store server 124. The workstation 110 and the servers 118, 120, 122 and 124 may communicate with each other via any desired communication technique, protocol, or standard. The servers 118, 120, 122, and 124 may correspond with respective services provided by a single workstation, such as the workstation 110. The components of the control system 104 may be coupled to one another via a data bus or network (not shown) and need not be connected via respective, dedicated communication lines as shown. Any one or more of the components of the control system 104 may be implemented as a service unit, module, or other unit implemented by a common physical machine or other device. Additional, different, or fewer components may be provided, such as combining two or more servers or providing the workstation functionality on a server or vice versa.

The pulse sequence server 118 functions in response to instructions downloaded from the workstation 110 to operate a gradient system 126 and a radio frequency ("RF") system 128. Scan sequences containing data indicative of the RF pulses and gradients may be stored in a library or other memory of the pulse sequence server 118 or other component of the control system 104. Gradient waveforms to perform the prescribed scan are produced and applied to the gradient system 126 that excites gradient coils in a gradient coil assembly 130 to produce the magnetic field gradients $G_x$, $G_y$, and $G_z$ used for position-encoding MR signals. The gradient coil assembly 130 forms part of a magnet assembly 132 that includes an annular or other polarizing magnet 134 and a whole-body RF coil array 136. In some cases, the whole-body RF coil array 136 is constructed in the form of a so-called birdcage antenna and has a number of individual antenna rods which run parallel to the patient tunnel and uniformly distributed in a circumferential arrangement around the patient tunnel. The individual antenna rods may be capacitively coupled to one another in a ring shape at one end of the birdcage antenna. A depiction of an exemplary birdcage antenna is shown and described in U.S. Patent Publication No. 2010/0327868 ("SAR Calculation for Multichannel MR Transmission Systems"), the entire disclosure of which is incorporated by reference.

RF excitation waveforms are applied to the RF coil array 136 by the RF system 128 to perform a selected magnetic resonance pulse sequence. Responsive MR signals detected by the RF coil array 136 or a separate local coil (not shown) are received by the RF system 128, amplified, demodulated, filtered and digitized under direction of the pulse sequence server 118. The RF system 128 includes an RF transmitter for producing a wide variety of RF pulses used in MR pulse sequences. The RF transmitter is responsive to the selected scan sequence and direction from the pulse sequence server 118 to produce RF pulses of the desired frequency, phase and pulse amplitude waveform. The generated RF pulses may be applied to the whole body RF coil array 136 or to one or more local coils or coil arrays. As described below, the RF transmitter includes a plurality of transmission channels to produce RF pulses formed via the superimposition of the RF B1+ fields generated by each transmission channel.

The RF system 128 also includes one or more RF receiver channels. Each RF receiver channel includes an RF amplifier that amplifies the MR signal received by the coil to which it is connected. Each receiver may also include a detector that collects and digitizes in-phase (I) and quadrature (Q) components of the received MR signal.

The pulse sequence server 118 may receive patient data from a physiological acquisition controller 138. The controller 138 receives signals from a number of different sensors connected to the patient, such as ECG signals from electrodes or respiratory signals from a bellows. Such signals are typically used by the pulse sequence server 118 to synchronize, or "gate", the implementation of the scan sequence with the subject's respiration or heart beat.

The pulse sequence server 118 also connects to a scan room interface circuit 140 that receives signals from various sensors associated with the condition of the patient or subject and the magnet system. It is also through the scan room interface circuit 140 that a subject positioning system 142 receives commands to move the subject to desired positions during the scan sequence. The subject positioning system 142 may direct one or more motors (not shown) that drive a bed and, thus, the subject, to a desired position.

The digitized MR signal samples produced by the RF system 128 are received by the data acquisition server 120. The data acquisition server 120 operates in response to instructions downloaded from the workstation 110 to receive the real-time MR data and provide buffer storage such that no data is lost by data overrun. In some scan sequences, the data acquisition server 120 passes the acquired MR data to the data processor server 122. In scans that require information derived from acquired MR data to control the further performance of the scan, the data acquisition server 120 may be programmed to produce such information and convey it to the pulse sequence server 118. For example, during calibration or other pre-scans, MR data is acquired and used to calibrate the pulse sequence performed by the pulse sequence server 118. The calibration data may be stored in a memory or storage device or other unit of, associated with, or in communication with, any of the aforementioned servers or other devices. Also, navigator signals may be acquired during a scan and used to adjust RF or gradient system operating parameters or to control the view order in which k-space is sampled. The data acquisition server 120 may be employed to process MR signals used to detect the arrival of contrast agent in a magnetic resonance angiography (MRA) scan. In all these examples, the data acquisition server 120 may acquire MR data and process the MR data in real-time to produce information used to control the scan.

The data processing server 122 receives MR data from the data acquisition server 120 and processes the MR data in accordance with instructions downloaded from the workstation 110. Such processing may include, for example, Fourier transformation of raw k-space MR data to produce two or three-dimensional images, the application of filters to a reconstructed image, the performance of back-projection image reconstruction of acquired MR data, the calculation of functional MR images, the calculation of motion or flow images, segmentation, rendering, or other visualization processes.

Images reconstructed by the data processing server 122 are conveyed back to the workstation 110 for storage and/or display. Real-time images may be stored in a database memory cache (not shown) from which they may be output to the display 112 or an auxiliary terminal or console 144, which may be located near the magnet assembly 132 for use by attending physicians or other operators. Batch mode images or selected real time images are stored in a database on mass storage device 146, which may include any desired storage medium. When such images have been reconstructed and transferred to storage, the data processing server 122 notifies the data store server 124 on the workstation 110. The workstation 110 may be used by an operator to archive the images, produce films, or send the images via a network to other facilities.

Figure 2:
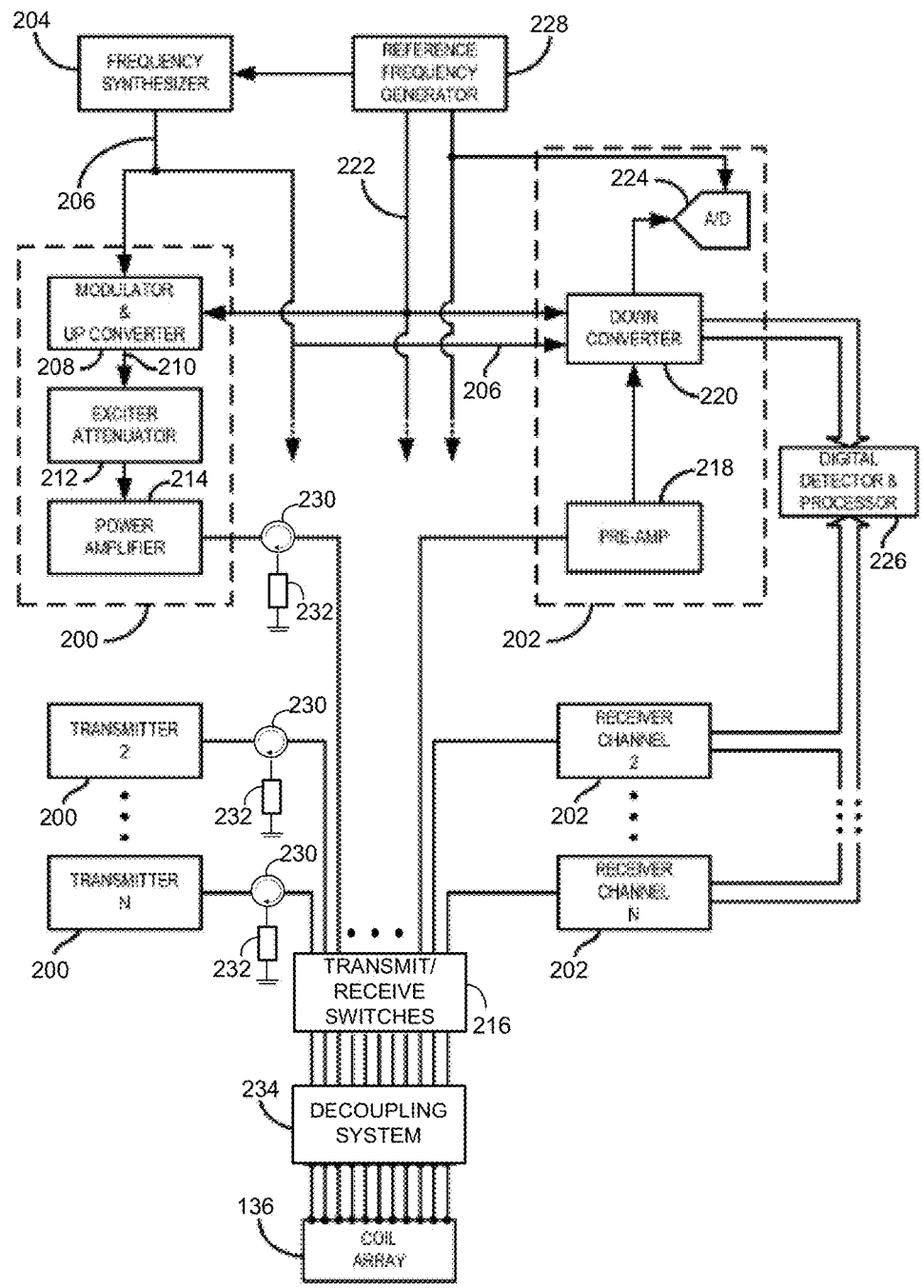
FIG. 2 is a block diagram of an RF system and other components of the MRI system of FIG. 1 to depict a parallel transmission architecture of the MRI system configured in accordance with one embodiment.

Referring now to FIG. 2, the RF system 128 and other components of the system 100 are shown in greater detail. The whole body coil array 136 generally includes a plurality of coil elements that can be separately driven by a plurality of RF transmitters 200 to produce a desired RF field-of-excitation. Each RF transmitter 200 forms one of the array of channels that, when superimposed, collectively define the composite RF signal. The coil array 136 may also be used with a plurality of receive channels 202. Alternatively or additionally, another whole body RF coil array (not shown) or another local RF coil may be used to acquire the MR signals. A variety of different coil array structures may be used as part of the system 100 of FIG. 1.

The RF system 126 includes a set of transmitters 200, each of which produces an individual, selected RF excitation field. The base, or carrier, frequency of this RF excitation field is produced under control of a frequency synthesizer 204, which receives a set of digital control signals from the pulse sequence server 118. These control signals may include data representative of the frequency and phase of the RF carrier signal, which may be produced at an output 206. The RF carrier is applied to a modulator and up converter 208 in each transmitter 200, where its amplitude is modulated in response to a signal also received from the pulse sequence server 118. The signal defines the envelope of the RF excitation pulse to be produced and is generated by sequentially reading out a series of stored digital values. These stored digital values may be changed to enable any desired RF pulse envelope to be produced by each transmitter 200.

The magnitude of the RF excitation pulse produced at an output 210 is attenuated by an exciter attenuator circuit 212 in each transmitter 200. Each attenuator circuit 212 receives a digital command from the pulse sequence server 118. The attenuated RF excitation pulses are applied to a power amplifier 214 in each transmitter 200. The power amplifiers 214 are current source devices that connect to respective transmit inputs on a set of transmit/receive switches 216. In this example, a desired number N (e.g., 16) of the transmitters 200 are employed and connected through a corresponding number N of the transmit/receive switches 216 to a corresponding number N of the coil elements in the RF coil array 136. Other transmitter arrangements may be used.

The signal produced by the subject is picked up by the coil array 200 and applied to the inputs of the set of receive channels 202. A pre-amplifier 218 in each receiver channel 202 amplifies the signal by an amount determined by a digital attenuation signal received from the pulse sequence server 118 (FIG. 1). The received signal is at or around the Larmor frequency, and this high frequency signal is down converted in a two-step process by a down converter 220, which first mixes the NMR signal with the carrier signal on the line 206, and then mixes the resulting difference signal with a reference signal on a line 222. The down converter NMR signal is applied to the input of an analog-to-digital ("A/D") converter 224 which samples and digitizes the analog signal and applies it to a digital detector and signal processor 226. The digital detector and signal processor 226 produces 16-bit in-phase (I) values and 16-bit quadrature (Q) values corresponding to the received signal, but other formats may be used. The resulting stream of digitized I and Q values of the received signal are output to the data acquisition server 120 (FIG. 1). The reference signal as well as the sampling signal applied to the A/D converter 224 are produced by a reference frequency generator 228.

The transmit/receive switches 216 are controlled and directed by the pulse sequence server 118 (FIG. 1) to connect the N transmitters 200 to the N coil elements in the coil array 136 during those parts of the pulse sequence in which an RF field is to be produced. Each transmitter 200 is separately controlled by the pulse sequence server 118 (FIG. 1) to produce an RF field of a desired amplitude, frequency, phase, and envelope at each of the N coil elements. The combined RF fields of the N coil elements produce the prescribed $B_1$ field throughout the region of interest in the subject during the imaging phase of the procedure.

When the $B_1$ field is not produced, the pulse sequence server 118 directs the transmit/receive switches 216 to connect each of the N receive channels to the respective N coil elements. Signals produced by the excited spins in the subject are picked up and separately processed as described above.

Circulators 230 may be incorporated into each transmit channel. In the embodiment of FIG. 2, each transmit channel includes a respective one of the circulators 230 connected between the power amplifier 214 and the transmit/receive switch 216. The circulators 230 are directed to protecting the power amplifiers 214 from power reflected back from the coil array 136 or coupled from one of the other channels.

Each circulator 230 is configured to redirect such reflected or coupled power to a grounded, resistive load 232 for dissipation.

The RF system 128 includes a decoupling system 234 to remove or reduce inductive and resistive coupling between the coils of the coil array 136. The decoupling system 234 is coupled to the coil array 136 and the transmitters 200. In the example shown in FIG. 2, the decoupling system 234 is disposed between the transmit/receive switches 216 and the coil array 136 to reflect the possibility that, in some embodiments, the decoupling system 234 may connect both the transmit and receive channels of the RF system 128 to the coil array 136. Other connection arrangements may be used, including, for instance, ones in which the decoupling system 234 connects only the transmit channels to the coil array 136. Despite the decoupling of the coil array 136 provided by the decoupling system 234, the circulators 230 may be used to provide additional protection for the transmitters 200 and the power amplifiers 214 thereof.

The decoupling system 234 is configured in accordance with a decoupling matrix to attain a decoupled operating condition for the coil array 136. Each element of the decoupling matrix is representative of an impedance between a respective pair of nodes, each node being associated with either a respective one of the transmitters 200 or a respective one of the coils of the coil array 136. As described below, the elements of the decoupling matrix are optimized to minimize an objective function (e.g., a cost function) based on impedance matrix data for the coil array 136 without the decoupling system 234. The objective function is representative of deviation from the decoupled operating condition.

In some cases, the decoupling system 234 includes a set of reactive elements (e.g., capacitors). The reactive elements are arranged in a network between the nodes. For example, each reactive element connects a respective pair of nodes associated with the transmitters 200 and the coil array 236. In some embodiments, each reactive element is configured in accordance with a respective element of an admittance matrix derived from the decoupling matrix.

Figure 3:
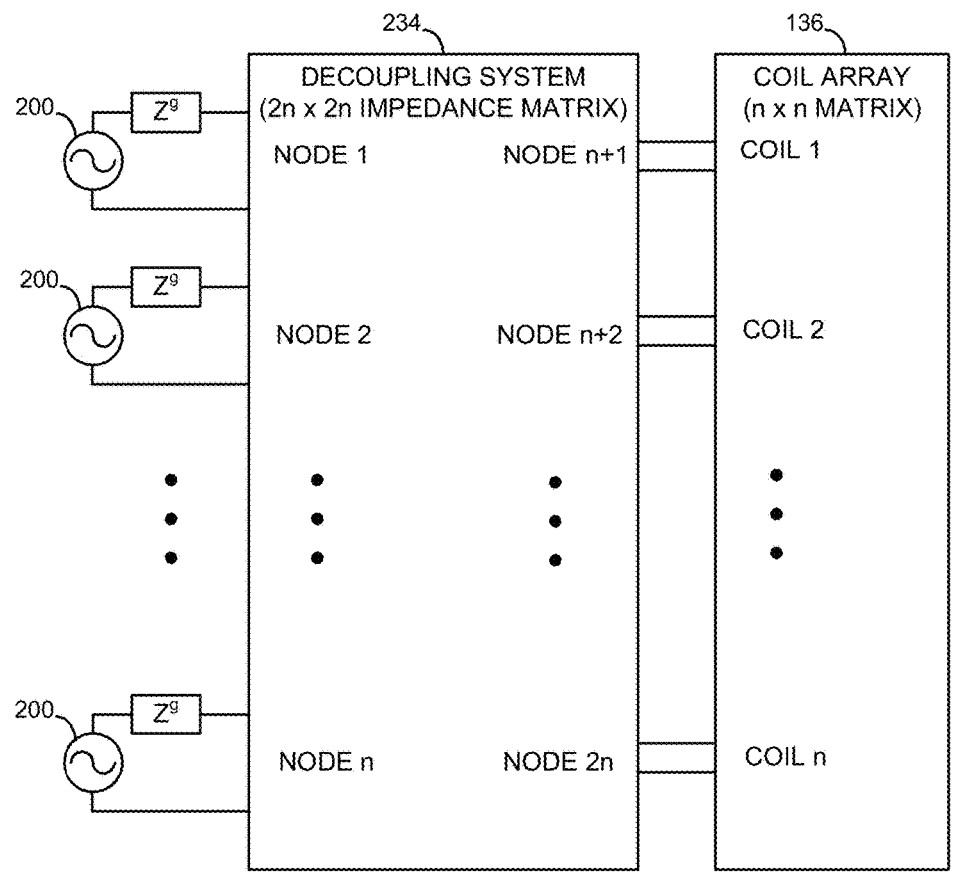
FIG. 3 is a block diagram showing a decoupling system of the parallel transmission architecture of FIG. 2 configured in accordance with one embodiment.

FIG. 3 depicts the decoupling system 234 in accordance with one embodiment in greater detail. The decoupling system 234 couples N channels (e.g., 16 channels) to an equal number of coils in the coil array 136. Each channel has a respective one of the transmitters 200. Each transmitter 200 is represented as a voltage source (or generator) and an impedance Zg (e.g., 50 Ohms). Without any coupling between the channels, each respective coil of the coil array 136 would only be coupled to a respective one of the impedances Zg. The decoupling system 234 may be configured to remove such coupling as described below.

The decoupling system 234 has N ports for the nodes on an input side and N ports for the nodes on an output side for a total of 2N ports. The decoupling system 234 is configured as a 2N port network. In this example, node 1 through node n are on the input side and node n+1 through node 2n are on the output side. The network includes respective impedances (or admittances) coupling each node to every other node. A node may also be connected to itself via, e.g., a self-impedance (or self-admittance). The network may thus be configured in accordance with a 2N×2N decoupling matrix.

The decoupling matrix is configured in accordance with a decoupling condition. The decoupling condition is representative of a condition in which the coil array 136 is completely decoupled. The decoupling condition may be expressed as a target impedance matrix Zout that corresponds with the impedances of the transmitters 200. The target impedance matrix Zout thus corresponds with the resulting output impedance of the decoupling network at the source side. The target impedance matrix Zout is thus a diagonal matrix with the values Zg along the diagonal (e.g., diag (50 Ohms)).

With the unknown impedance of the decoupling matrix Zc expressed as $\{Z_{11}, Z_{12}, Z_{21}, Z_{22}\}$, the decoupling condition (and diagonalization of the decoupling matrix) may be expressed as follows: $Zout = Z_{11} - Z_{12}(Z_{22}+Z)^{-1}Z_{21}$, where Z is a matrix representative of the impedance of the coil array 136 before decoupling (i.e., the coil array 136 with the inductive coupling to be removed or reduced). The coupling between each coil in the coil array 136 and every other coil in the coil array 136 may be expressed as an N×N matrix. Due to the coupling of the coil array 136, the matrix Z may deviate significantly from a diagonal matrix representative of decoupled channels, with any number of complex elements off the diagonal.

With the decoupling condition, the decoupling matrix Zc is determined based on the impedance Z of the coil array 136. The resulting decoupling system 234 may thus be customized for a given coil array.

The unknown impedance Zc includes a four block or component structure. The block $Z_{11}$ is representative of the impedances (or admittances) between the input nodes. The blocks $Z_{12}$ and $Z_{21}$ are representative of the impedances (or admittances) between the input nodes and the output nodes. In some embodiments, the decoupling matrix may be configured in accordance with a symmetry condition, as described below. The block $Z_{22}$ is representative of the impedances (or admittances) between the output nodes. The diagonal of the matrix Zc corresponds with the impedances (or admittances) between the inputs themselves and the outputs themselves.

The decoupling matrix Zc is then defined or determined in accordance with one or more conditions or constraints in addition to the decoupling condition. For example, one condition may be a lossless condition that specifies that the decoupling system 234 only include reactive components (i.e., passive and non-resistive circuit components). Another exemplary condition for passive reciprocal networks may be that the decoupling matrix is symmetrical, such that $Z_{12}=Z_{21}^T$, $Z_{11}=Z_{11}^T$, and $Z_{22}=Z_{22}^T$. Additional, fewer, or alternative conditions may be specified. For example, in some embodiments, the decoupling system 234 may include one or more active components. Other conditions may relate to the nature of the components (e.g., lumped or distributed) and/or the number of components or complexity of the network, or the robustness of the decoupling condition to imperfections in real-life implementation.

To determine the decoupling matrix Zc in accordance with the decoupling and other conditions, an optimization procedure is implemented to minimize an objective function. The objective function may include a least squares cost function based on the deviation from the target impedance matrix (e.g., the 50 Ohm diagonal matrix). The cost function may be expressed as follows: $\|Z_{out}-Z_u\|_2^2$. The matrix Zu is representative of the target impedance matrix (e.g., the 50 Ohm diagonal matrix). The least squares cost function may also be expressed as follows:

$$\min_x \|f(x)\|_2^2 = \min_x (f_1(x)^2 + f_2(x)^2 + \ldots + f_n(x)^2)$$

where x may be expressed as follows:

$$x = \begin{bmatrix} vec(Z'_{11}) \\ vec(Z'_{21}) \\ vec(Z'_{12}) \\ vec(Z'_{22}) \end{bmatrix}$$

The optimization procedure may implement a non-linear optimization solver to numerically determine or define the decoupling matrix that meets the decoupling condition. In some embodiments, the Jacobian of the cost function is computed to support the optimization procedure. The Jacobian may be expressed as follows:

$$J = [I \otimes I - I \otimes Z_{12}(Z_{22}+Z)^{-1} - (Z_{22}+Z)^{-1}Z_{21} \otimes I(Z_{12}{}^T \otimes Z_{12})((Z_{22}+Z)^{-T}(Z_{22}+Z)^{-1})].$$

and in terms of the cost function f as follows:

$$J = \begin{bmatrix} \dfrac{\partial f}{\partial Z'_{11}} & \dfrac{\partial f}{\partial Z'_{21}} & \dfrac{\partial f}{\partial Z'_{12}} & \dfrac{\partial f}{\partial Z'_{22}} \end{bmatrix}$$

The non-linear optimization solver may then determine the decoupling matrix Zc that minimizes the cost function. A variety of different optimization solvers may be used.

The resulting decoupling matrix may then be used to configure the impedance (or admittance) network of the decoupling system 234. The decoupling system 234 is customized for a given coil array. Connecting the decoupling system 234 to the transmitters 200 and the coil array 136 as shown in FIG. 3 diagonalizes the impedance network seen by the transmitters 200, thereby removing the coupling presented by the coil array 136.

Figure 4:
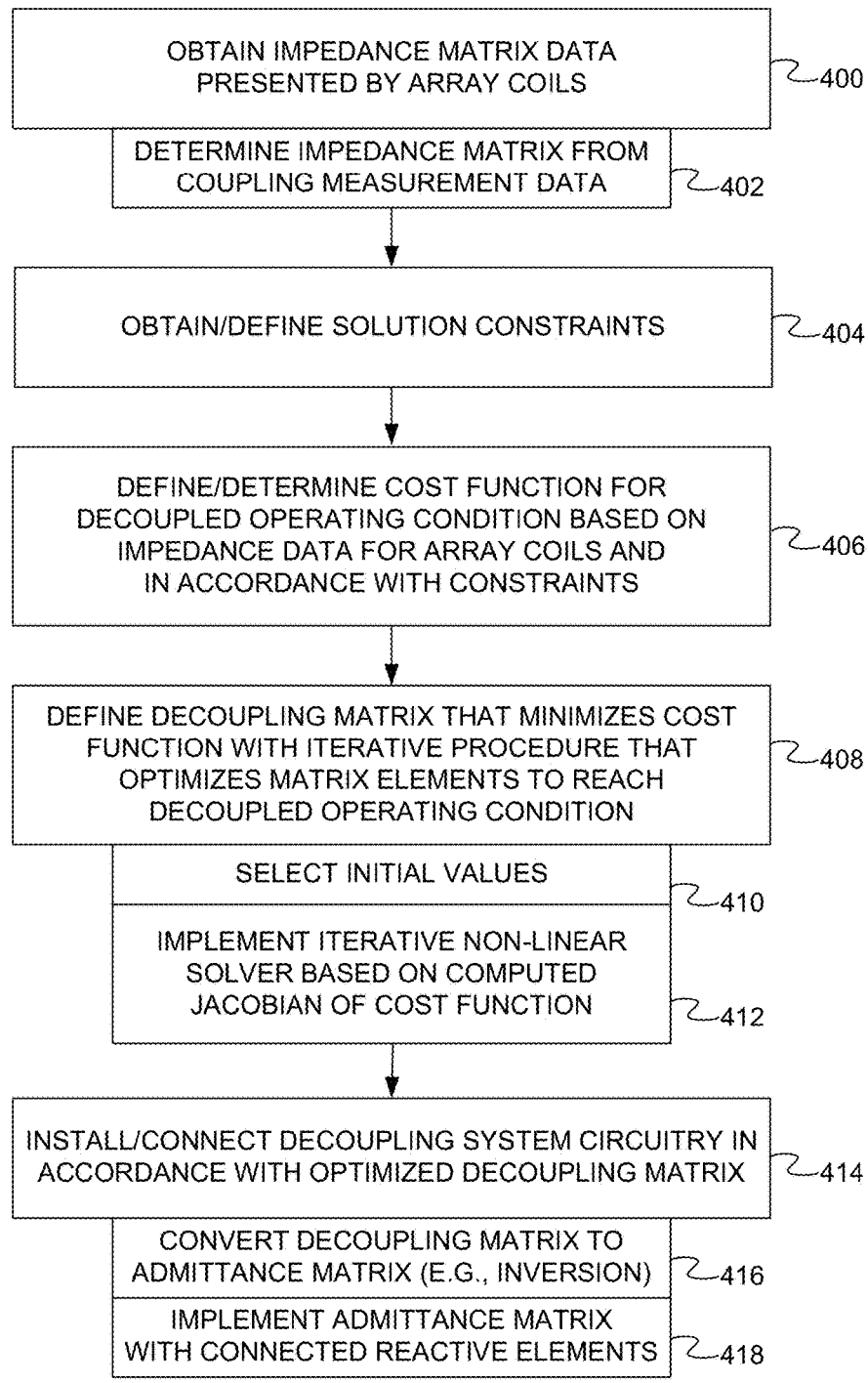
FIG. 4 is a flow diagram of a method of configuring a parallel transmission MRI system with a decoupling system in accordance with one embodiment, the method including the definition of a decoupling matrix for an array of coils of the parallel transmission MRI system.

FIG. 4 depicts a method of configuring a parallel transmission MRI system with a decoupling system for an array of coils of the parallel transmission MRI system. The method determines or defines a decoupling matrix of the decoupling system, such as the decoupling matrix described above.

The method is computer-implemented. For example, the method may be implemented by the workstation 110 (FIG. 1). One or more acts of the method may thus be implemented with the processor 116 (FIG. 1). Other workstations, computers, or other computing systems may be used. Computer-executable instructions to be executed by the processor(s) of such computing systems to implement the method may be stored on one or more computer-readable storage media. For example, such instructions may be stored in a memory and/or storage device of the workstation 110, the data store server 124 (FIG. 1), or any other memory and/or storage device.

The order of the acts may vary. For example, one or more solution constraints or conditions (e.g., lossless components) may be obtained, defined, or specified at the outset. Additional, fewer, or alternative acts may be implemented. For example, one or more of the solution constraints may be pre-defined.

The method may begin in an act 400 in which impedance matrix data for a given array of coils without the decoupling system (e.g., the impedance matrix Z described above) is received, accessed, or otherwise obtained. In some embodiments, the impedance matrix data may be determined in an act 402 from coupling measurement data for the array. One or more simulations or other measurements may be conducted. In other cases, the impedance matrix data may be accessed from a data store.

One or more solution constraints or conditions may be defined or otherwise obtained in an act 404. For example, the constraints may specify that the decoupling system include only lossless components and/or only passive components. Other constraints may be directed to decoupling matrix symmetry as described above. The number and nature of the solution constraints may vary as described above. In some cases, no constraints are specified (other than the decoupling condition).

In an act 406, an objective function is determined based on the impedance matrix data for the array of coils. The objective function is representative of the deviation from a decoupled operating condition for the array of coils in which the coils are decoupled via the decoupling system. The objective function may include a least squares cost function based on a difference between the decoupling matrix and a target impedance matrix representative of the array of coils in the decoupled operating condition. In this embodiment, the objective function is also determined in accordance with the solution constraint(s).

A decoupling matrix is then determined or defined in an automated manner with a processor in an act 408. The decoupling matrix is representative of a set of impedances of the decoupling system. Each element of the decoupling matrix may be representative of an impedance between a respective pair of nodes associated with the array of coils. As described above, the decoupling matrix is defined via the implementation of an iterative procedure that optimizes elements of the decoupling matrix to minimize the objective function and reach the decoupled operating condition. The iterative procedure may include the implementation of an optimization procedure.

At the outset of the iterative procedure, initial values for the elements of the decoupling matrix may be specified or selected in an act 410. The initial values may be randomly assigned.

In the embodiment of FIG. 4, defining the decoupling matrix includes iteratively implementing, with the processor, a non-linear optimization solver in an act 412. Any non-linear optimization solver may be used. The Jacobian of the objective function is computed for each iteration. For example, the iterative procedure may be based on a computed Jacobian matrix of the least squares cost function as described above.

The resulting decoupling matrix may then be used to configure the MRI system for the given coil array. In an act 414, decoupling system circuitry is installed or connected in accordance with the decoupling matrix. The manner in which the decoupling matrix is realized in decoupling system circuitry may vary. For example, in some cases, the impedance network specified by the decoupling matrix is converted in an act 416 to an admittance matrix (e.g., via matrix inversion). The admittance matrix may then be implemented with a connected network of reactive elements in an act 418. Each admittance in the admittance matrix may correspond with a respective admittance in the admittance network of the decoupling system.

FIGS. 5-10 present the results of an exemplary simulation of the disclosed embodiments in connection with a pTx 3T body coil with 16 channels distributed in two rows. The fields and frequency response of the coils of the body coil when loaded with the tissue types (e.g., 33 types) of the Ansys body model were simulated (e.g., via an HFSS electromagnetic field simulation) to obtain the impedance matrix of the body coil. During the simulation, the coil was tuned (123.2 MHz) and matched (−30 dB), but was not decoupled.

Figure 5:
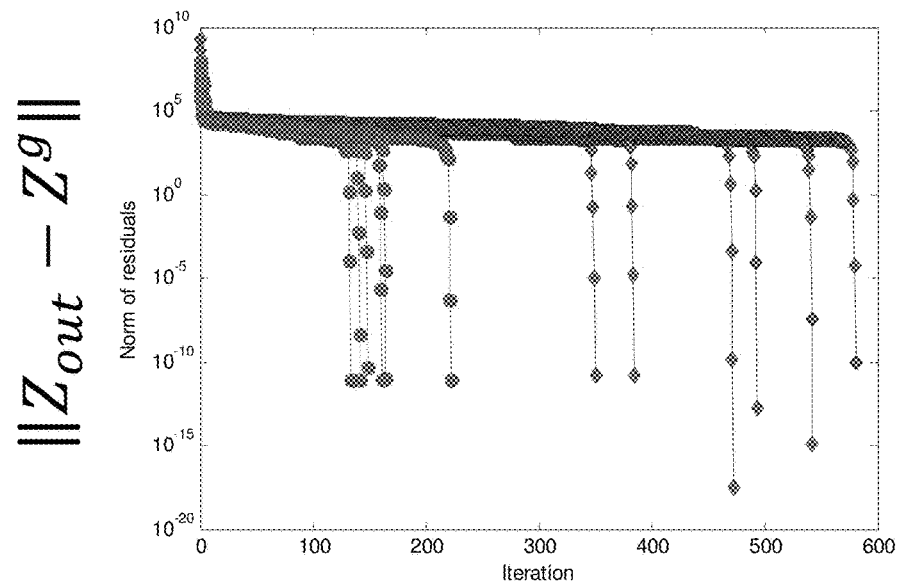
FIG. 5 is a graphical plot showing convergence results of an exemplary implementation of the method of FIG. 4.

FIG. 5 depicts a plot of the norm of residuals, depicting convergence in about 150-200 iterations of the optimization procedure given a number of random initial guesses. The optimization procedure converges to distinct solutions depending on the initial guess. The non-uniqueness of the solution matrices may be useful in allowing specification of additional conditions or constraints, such as limiting the capacitance and inductance values, and robustness of the solution matrix to external factors.

The optimizations shown in FIG. 5 that converged within about 100 to about 200 iterations were completed in about 50 seconds and were configured with a symmetry constraint, thereby defining a symmetric decoupling system. The other optimizations shown in FIG. 5 (converging within about 300 or more iterations) were configured to define a non-symmetric decoupling system, and were completed in about 150 seconds.

Figure 6:
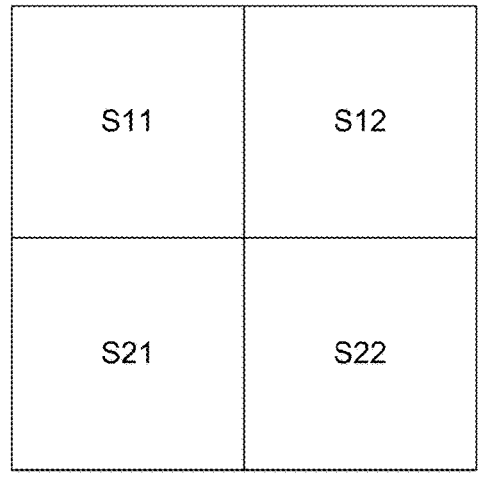
FIG. 6 is a schematic diagram of a decoupling matrix representative of the decoupling system of FIG. 3.

FIG. 6 depicts a representation of the mixing coefficients S of the decoupling matrix. For instance, a block S21 contains the mixing coefficients between the transmitters and the coil array. In a 16-channel example, the mixing coefficients are expressed as a 32×32 matrix. Thus, if the transmitters generate a voltage vector x (16 voltages), then individual coils are excited with the product S21*x.

Figure 7:
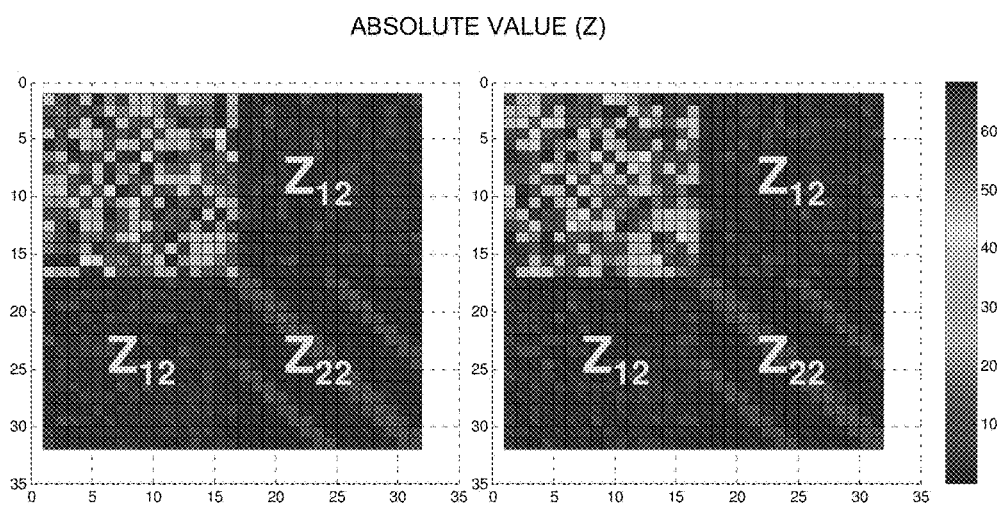
FIG. 7 shows graphical plots of exemplary decoupling matrices resulting from implementation of the method of FIG. 4.

FIG. 7 shows the structure and impedance magnitudes of two of the decoupling matrices resulting from the optimization procedure. Each decoupling matrix includes a Z11 block (upper left), a Z12 block (upper right), a Z21 block (lower left, another Z12 block in this example), and a Z22 block (lower right). The blocks of the decoupling matrix correspond with the mixing coefficients shown in FIG. 6. The lower right block of the decoupling matrix ($Z_{22}$) has a specific structure defined by the original coil assembly, where every coil is coupled to its neighbors. The decoupling matrix achieves nearly perfect decoupling in a numerically simulated array, as S12 was reduced from about −2 dB to about −200 dB.

The fact that the implementation of the optimization procedure may produce non-unique outcomes (e.g., more than one optimal decoupling matrix) may be useful because additional constraints may be specified for further customization. The non-unique outcomes may also present an opportunity for robust optimization.

Figure 8:
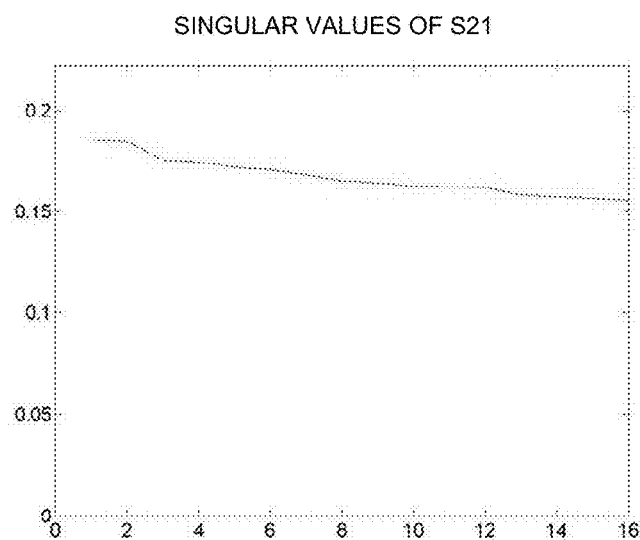
FIG. 8 is a graphical plot of exemplary singular values of decoupling matrix coefficients resulting from implementation of the method of FIG. 4.

FIG. 8 is a plot showing that the singular values of S21 are all similar in magnitude and non-zero. These values reflect that the outputs of the decoupling system are not degenerate. The fields associated with every output may thus be sufficiently different to be useful for pulse design. The decoupling systems of the disclosed embodiments may thus avoid decreasing the number of degrees of freedom.

Figure 9:
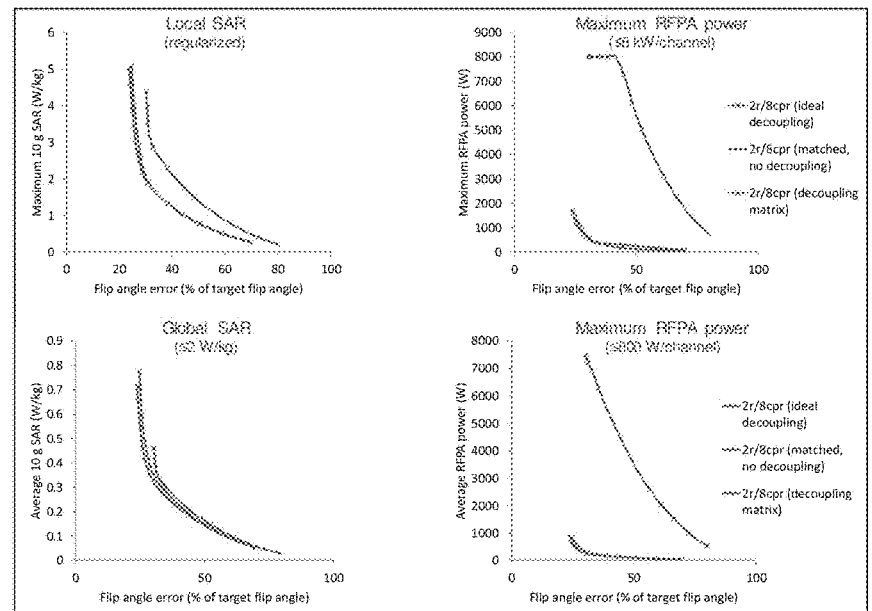
FIGS. 9 and 10 show graphical plots of simulations of local SAR, global SAR, and maximum power for RF shimming pulse and 2-spoke pulse sequences implemented on an MRI system configured in accordance with one embodiment.
Figure 10:
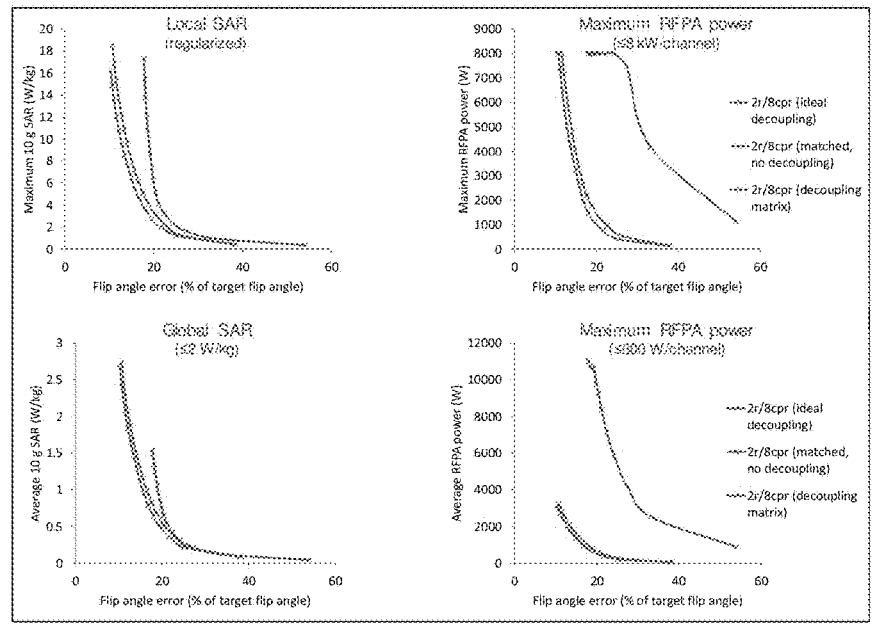

FIGS. 9 and 10 include a number of plots to show that the coupled (i.e., non-decoupled) arrays consume significantly more power than the arrays once decoupled by the decoupling systems of the disclosed embodiments. The plots show the L curves corresponding to RF-shimming pulses and a two spokes pulse design applied (i) with the coupled array, (ii) the array decoupled using our decoupling matrix and (iii) the array ideally decoupled in simulation. Least-square pulses were computed while explicitly constraining local SAR and power. The plots show that the coupled array was able to achieve a similar local SAR vs. fidelity tradeoff than the uncoupled ones however at the cost of greatly increased power consumption.

With the total power limited via the decoupling system as shown in the plots of FIGS. 9 and 10, the region of the local SAR L-curve that may be accessed is also essentially limited.

There was no significant difference in performance between the ideally decoupled array and the array decoupled using our decoupling matrix. This also shows that the decoupling matrix produces mixed outputs that are non-degenerate and are therefore useful for pulse design (i.e., the singular values of the mixing matrix are all of the same magnitude).

The disclosed embodiments present a framework to automatically design decoupling matrices for pTx arrays with many channels (e.g., more than eight channels). The disclosed embodiments optimally select the decoupling matrix by enforcing one or more other conditions or constraints on the network of the decoupling system, such as reciprocity, passivity and lossless-ness. The disclosed embodiments utilize an optimization procedure that converges to define a decoupling matrix that achieves near perfect decoupling. The decoupling matrix may be used to implement or realize a circuit using, e.g., lumped elements. The circuit may be realized via inversion to an admittance matrix as described above.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. A method for operating a parallel transmission magnetic resonance imaging (MRI) system with an improved decoupling system, the method comprising:
    obtaining impedance matrix data for an array of coils of the MRI system without the decoupling system;
    determining, based on the impedance matrix data for the array of coils, an objective function representative of deviation from a decoupled operating condition for the array of coils in which the coils are decoupled via the decoupling system, wherein the objective function comprises a least squares cost function based on a difference between the decoupling matrix and a target impedance matrix representative of the array of coils in the decoupled operating condition;
    using an iterative, non-linear optimization solver to determine a decoupling matrix that minimizes the objective function, wherein the decoupling matrix specifies a set of impedances of the decoupling system;
    using the decoupling matrix to configure the decoupling system of the MRI system to reduce or eliminate the transmission of power from one channel to other channels of the MRI system and provide an improved power efficiency when obtaining image data using the MRI system; and
    storing the image data in a non-volatile computer readable medium from which the image data can be output to a display.

2. The method of claim 1, wherein each element of the decoupling matrix is representative of an impedance between a respective pair of nodes associated with the array of coils.

3. The method of claim 1, wherein obtaining the impedance matrix data for the array of coils comprises determining an impedance matrix for the array of coils based on coupling measurement data for the array of coils without the decoupling system.

4. The method of claim 1, wherein the non-linear optimization solver is based on a computed Jacobian matrix of the least squares cost function.

5. The method of claim 1, wherein the least squares cost function is determined in accordance with a plurality of constraints on the decoupled operating condition.

6. The method of claim 1, wherein the least squares cost function is determined in accordance with a constraint specifying that the set of impedance of the decoupling system are lossless.

7. The method of claim 1, wherein the least squares cost function is determined in accordance with a constraint specifying that the decoupling matrix is symmetrical.

8. The method of claim 1, wherein defining the decoupling matrix comprises selecting initial values of the elements of the decoupling matrix before implementing the iterative procedure.

9. A method of configuring a parallel transmission magnetic resonance imaging (MRI) system with a decoupling system for an array of coils of the parallel transmission MRI system, the method comprising:
    obtaining impedance matrix data for the array of coils without the decoupling system;
    determining, based on the impedance matrix data for the array of coils, a cost function representative of deviation from a decoupled operating condition for the array of coils in which the coils are decoupled via the decoupling system, wherein the objective function comprises a least squares cost function based on a difference between the decoupling matrix and a target impedance matrix representative of the array of coils in the decoupled operating condition;
    using an iterative, non-linear optimization solver to determine a decoupling matrix that minimizes the objective function, wherein the decoupling matrix specifies a set of impedances of the decoupling system;
    configuring the decoupling system to the array of coils based on the optimized elements of the decoupling matrix such that, when in use, the parallel transmission MRI system reduces or eliminates the transmission of power from one channel to other channels of the MRI system and provides an improved power efficiency when obtaining image data using the MRI system; and
    storing the image data in a non-volatile computer readable medium from which the image data can be output to a display.

10. The method of claim 9, wherein connecting the decoupling system comprises converting the decoupling matrix into an admittance matrix.

11. The method of claim 10, wherein:
    the decoupling system comprises a set of reactive elements; and
    each reactive element is configured in accordance with a respective element of the admittance matrix.

12. The method of claim 9, wherein each element of the decoupling matrix is representative of an impedance between a respective pair of nodes associated with the array of coils.

13. The method of claim 9, wherein obtaining the impedance matrix data for the array of coils comprises determining an impedance matrix for the array of coils based on coupling measurement data for the array of coils without the decoupling system.

14. The method of claim 9, wherein the non-linear optimization solver is based on a computed Jacobian matrix of the least squares cost function.

15. The method of claim 9, wherein the least squares cost function is determined in accordance with a plurality of constraints on the decoupled operating condition.

16. The method of claim 9, wherein the least squares cost function is determined in accordance with a constraint specifying that the set of impedance of the decoupling system are lossless.

17. The method of claim 9, wherein the least squares cost function is determined in accordance with a constraint specifying that the decoupling matrix is symmetrical.

18. The method of claim 9, wherein defining the decoupling matrix comprises selecting initial values of the elements of the decoupling matrix before implementing the iterative procedure.

19. A magnetic resonance imaging (MRI) system comprising:
    a plurality of transmitters to generate a parallel transmission radio frequency (RF) pulse;
    an array of coils coupled to the plurality of transmitters to apply the parallel transmission RF pulse to a subject; and
    a decoupling system connected to the plurality of transmitters and the array of coils and configured in accordance with a decoupling matrix to attain a decoupled operating condition for the array of coils;
    wherein each element of the decoupling matrix is representative of an impedance between a respective pair of nodes, each node being associated with either a respective one of the transmitters or a respective one of the coils;
    wherein the elements of the decoupling matrix are optimized using a non-linear optimization solver to minimize a least squares cost function based on impedance matrix data for the array of coils without the decoupling system, the least squares cost function being based on a difference between the decoupling matrix and a target impedance matrix representative of the array of coils in the decoupled operating condition, and
    wherein operation of the MRI system using the decoupling matrix reduces or eliminates the transmission of power from one channel to other channels of the MRI system and provides an improved power efficiency.

20. The MRI system of claim 19, wherein:
    the decoupling system comprises a set of reactive elements;
    each reactive element connects a respective pair of nodes associated with the plurality of transmitters and the array of coils; and
    each reactive element is configured in accordance with a respective element of an admittance matrix derived from the decoupling matrix.

* * * * *